US007393760B2

(12) United States Patent
Chien

(10) Patent No.: US 7,393,760 B2
(45) Date of Patent: Jul. 1, 2008

(54) METHOD FOR DICING GLASS SUBSTRATE

(75) Inventor: Shih-Che Chien, Tu-Cheng (TW)

(73) Assignee: Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/473,980

(22) Filed: Jun. 23, 2006

(65) Prior Publication Data

US 2007/0111482 A1 May 17, 2007

(30) Foreign Application Priority Data

Nov. 11, 2005 (CN) ........................ 2005 1 0101194

(51) Int. Cl.
*H01L 21/46* (2006.01)
*H01L 21/78* (2006.01)
*H01L 21/301* (2006.01)

(52) U.S. Cl. ........................ 438/463; 438/113; 438/460; 257/E21.506; 257/E21.599

(58) Field of Classification Search ................. 438/463, 438/460, 113, 473, 474, 464
See application file for complete search history.

(56) References Cited

U.S. PATENT DOCUMENTS

| | | | | | |
|---|---|---|---|---|---|
| 4,286,051 | A * | 8/1981 | Wagner | ...................... | 430/323 |
| 5,972,159 | A * | 10/1999 | Uryu et al. | .................. | 156/344 |
| 6,040,049 | A * | 3/2000 | Tominaga et al. | ..... | 428/355 EN |
| 6,770,960 | B2 * | 8/2004 | Oohata | ....................... | 257/678 |
| 6,872,635 | B2 * | 3/2005 | Hayashi et al. | ............. | 438/463 |
| 6,943,047 | B2 * | 9/2005 | Yanagisawa et al. | .......... | 438/22 |

* cited by examiner

*Primary Examiner*—David Nhu
(74) *Attorney, Agent, or Firm*—Jeffrey T. Knapp

(57) ABSTRACT

A method for dicing a sheet workpiece includes the following steps. A base (10) is provided. A water-soluble adhesive (20) is coated onto the base, and the workpiece is placed on the water-soluble adhesive. The water-soluble adhesive is hardened so as to, fix the workpiece on the base. The workpiece is diced to form cut pieces. The hardened water-soluble adhesive dissolves in water. The present method reduces the deformation of the hardened water-soluble adhesive and may thus eliminate chipping. Accordingly, the present method can contribute significantly to improving the production yield.

11 Claims, 1 Drawing Sheet

METHOD FOR DICING GLASS SUBSTRATE

TECHNICAL FIELD

The present invention generally relates to methods for dicing workpieces, and, more particularly, to a method for dicing glass substrate.

BACKGROUND

Currently, glass is in widespread use in optical products and semiconductor products, glass substrate can be diced to form small cut pieces serving as individual elements or parts.

One kind of method for dicing glass substrate includes the following steps. The glass substrate is adhered to an adhesive tape using a fixing means. In this state, the adhesive tape exhibits sufficient adhesion to the glass substrate to fix the glass substrate to the adhesive tape. The glass substrate is diced according to a predetermined plan by a dicing saw to form small cut pieces. The adhesive tape is exposed using an exposure source such as an ultraviolet lamp. In this state, the adhesion of the adhesive tape decreases, making it easy to remove the cut pieces from the adhesive tape. However, the glass substrate is very brittle and easily broken. The adhesive tape can be soft and may be significantly deformed by pressure from the dicing saw, the glass substrate cannot withstand the pressure and may become chipped.

Therefore, it is necessary to provide an improved method for dicing glass substrate.

SUMMARY

In one embodiment thereof, a method for dicing a sheet workpiece includes the following steps. A base is provided. A water-soluble adhesive is coated onto the base, and the workpiece is placed on the water-soluble adhesive. The water-soluble adhesive is hardened so as to fix the workpiece on the base. The workpiece is diced and the hardened water-soluble adhesive is dissolved in water.

Other novel features will become more apparent from the following detailed description when taken in conjunction with the accompanying drawing.

BRIEF DESCRIPTION OF THE DRAWING

Many aspects of the method for dicing glass substrate can be better understood with reference to the following drawing. The components in the drawing are not necessarily drawn to scale, the emphasis instead being placed upon clearly illustrating the principles of the present method for dicing glass substrate.

DETAILED DESCRIPTION OF THE EMBODIMENTS

Figure 1:
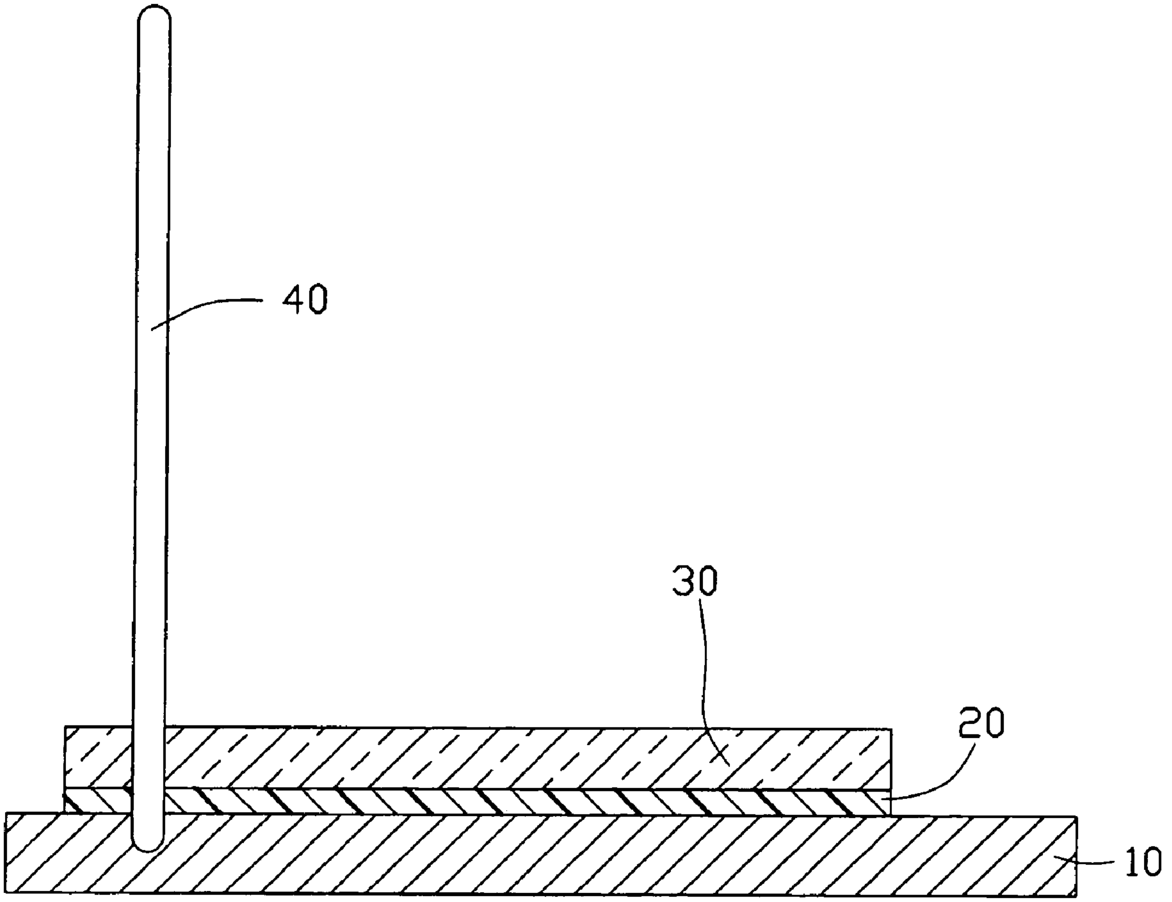
FIG. 1 is a schematic view of a dicing process in accordance with a preferred embodiment.

Referring to FIG. 1, a method for dicing glass substrate according to a preferred embodiment includes the following steps. A base 10 is provided. The base 10 is made of a rigid material, for example, glass. A water-soluble adhesive 20 is coated onto the base 10. In the illustrated embodiment, the water-soluble adhesive 20 is a water-soluble ultraviolet (UV) adhesive. A glass substrate 30 is placed on the water-soluble adhesive 20. In this state, the adhesion of the water-soluble adhesive 20 is weak. The water-soluble adhesive 20 can be hardened by an exposure source (not shown). In the illustrated embodiment, the exposure source can be an ultraviolet lamp. In this state, the water-soluble adhesive 20 has sufficient adhesive power to fix the glass substrate 30 to the water-soluble adhesive 20. The glass substrate 30 is diced according to a predetermined plan by a dicing saw 40 to form small cut pieces. The water-soluble adhesive 20 has sufficient adhesive power to hold the glass substrate 30 in place during dicing. Water (not shown) can be used to dissolve the hardened water-soluble adhesive 20. In this state, the adhesion of the water-soluble adhesive 20 decreases, making it easy to remove the cut pieces.

In the above-described dicing processes, the glass substrate 30 is held on the base 10 by the hardened water-soluble adhesive 20 thus preventing relative movement between the glass substrate 30 and the base 10. At the same time, both the hardened water-soluble adhesive 20 and the base 10 are relatively rigid, this reduces the deformation of the hardened water-soluble adhesive 20 by pressure from the dicing saw 40 and thus eliminates chipping. Accordingly, the present method can contribute significantly to improving the production yield.

Although a glass substrate is used in the above-described embodiment, this method of dicing glass substrate can also be applied to ceramic, quartz or rock crystal substrates.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for dicing a sheet workpiece, comprising the steps of:

providing a base;

coating a water-soluble adhesive onto the base, and placing the workpiece on the water-soluble adhesive;

hardening the water-soluble adhesive so as to fix the workpiece on the base;

dicing the workpiece; and dissolving the hardened water-soluble adhesive.

2. The method as claimed in claim 1, wherein the base is made of glass.

3. The method as claimed in claim 1, wherein the water-soluble adhesive is a water-soluble ultraviolet adhesive.

4. The method as claimed in claim 1, wherein the water-soluble adhesive is hardened by an exposure source.

5. The method as claimed in claim 1, wherein the water-soluble adhesive is hardened by exposure to ultraviolet light.

6. The method as claimed in claim 1, wherein the workpiece is diced by a dicing saw to form cut pieces.

7. The method as claimed in claim 6, further comprising a step of removing the cut pieces from the water-soluble adhesive.

8. The method as claimed in claim 1, wherein the hardened water-soluble adhesive dissolves in water.

9. The method as claimed in claim 1, wherein the workpiece is a glass substrate.

10. The method as claimed in claim 1, wherein the workpiece is made of a material selected from a group consisting of a ceramic material, quartz, and rock crystal.

11. The method as claimed in claim 1, wherein the step of dicing occurs after the workpiece is fixed on the base, and the step of dissolving the hardened water-soluble adhesive is performed after the step of dicing.

* * * * *